United States Patent
Satou

(10) Patent No.: US 8,734,934 B2
(45) Date of Patent: May 27, 2014

(54) SURFACE METAL FILM MATERIAL, METHOD OF PRODUCING SURFACE METAL FILM MATERIAL, METHOD OF PRODUCING METAL PATTERN MATERIAL, AND METAL PATTERN MATERIAL

(75) Inventor: Masataka Satou, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 103 days.

(21) Appl. No.: 13/141,988

(22) PCT Filed: Dec. 8, 2009

(86) PCT No.: PCT/JP2009/070543
§ 371 (c)(1),
(2), (4) Date: Jun. 24, 2011

(87) PCT Pub. No.: WO2010/073903
PCT Pub. Date: Jul. 1, 2010

(65) Prior Publication Data
US 2011/0256363 A1    Oct. 20, 2011

(30) Foreign Application Priority Data
Dec. 26, 2008    (JP) ................................ 2008-334170

(51) Int. Cl.
*B32B 15/00*    (2006.01)
(52) U.S. Cl.
USPC ........................ 428/209; 428/609; 428/612
(58) Field of Classification Search
USPC .................. 428/209, 615–630, 609, 612; 174/250–258
See application file for complete search history.

(56) References Cited

U.S. PATENT DOCUMENTS

| | | | | |
|---|---|---|---|---|
| 3,220,897 A | * | 11/1965 | Conley et al. ................. | 428/606 |
| 3,506,482 A | * | 4/1970 | Nakamura et al. ........... | 427/97.2 |
| 4,248,921 A | * | 2/1981 | Steigerwald et al. ......... | 428/148 |
| 4,767,665 A | * | 8/1988 | Seeger ........................... | 428/328 |
| 5,472,563 A | * | 12/1995 | Kogawa et al. ................ | 216/13 |
| 5,543,182 A | * | 8/1996 | Joshi et al. ................. | 427/443.1 |
| 5,846,606 A | * | 12/1998 | Wessling ....................... | 427/340 |
| 2010/0323174 A1 | | 12/2010 | Nagasaki et al. | |

FOREIGN PATENT DOCUMENTS

| | | |
|---|---|---|
| JP | 11-012504 A | 1/1999 |
| JP | 2001-085840 A | 3/2001 |
| JP | 2008-251711 A | 10/2008 |
| JP | 2008-274390 | 11/2008 |
| WO | 2008/050631 A | 5/2008 |

OTHER PUBLICATIONS

English language translation of the following: Office action dated May 28, 2013 from the JPO in a Japanese patent application corresponding to the instant patent application.
Chinese Office Action dated issued in corresponding Chinese Patent Application issued on Apr. 22, 2013.

* cited by examiner

*Primary Examiner* — Cathy Lam
(74) *Attorney, Agent, or Firm* — SOLARIS Intellectual Property Group, PLLC

(57) ABSTRACT

A surface metal film material including, in this order, a substrate, a polymer layer that receives a plating catalyst or a precursor thereof, and a metal film formed by plating, wherein, when x μm represents surface roughness (Ra) at the interface between the substrate and the polymer layer, and y μm represents surface roughness (Ra) at the interface between the polymer layer and the metal film, x>y and 5 μm>x>0.1 μm, and wherein, when T μm represents a thickness of the polymer layer, T and x satisfy the relationship 2x≤T.

2 Claims, No Drawings

SURFACE METAL FILM MATERIAL, METHOD OF PRODUCING SURFACE METAL FILM MATERIAL, METHOD OF PRODUCING METAL PATTERN MATERIAL, AND METAL PATTERN MATERIAL

TECHNICAL FIELD

The present invention relates to a surface metal film material, a method of producing a surface metal film material, a method of producing a metal pattern material, and a metal pattern material.

BACKGROUND ART

Conventionally, a metal wiring board obtained by forming a wiring including a metal pattern on a surface of an insulating substrate has been widely used in electronic parts or semiconductor elements.

As a method of producing such a metal pattern material, a "subtractive method" is mainly used. The subtractive method includes: disposing, on a metal film formed on a surface of a substrate, a photosensitive layer which is sensitized by irradiating with an actinic ray; imagewise exposing the photosensitive layer, then developing the photosensitive layer to form a resist image; subsequently etching the metal film to form a metal pattern; and finally pealing off the resist.

In the metal pattern obtained by the above method, adhesion between the substrate and the metal film is realized due to an anchoring effect generated by providing irregularities on the surface of the substrate. Therefore, owing to the irregularities at a substrate interface portion of the obtained metal pattern, there has been a problem in that high frequency characteristics are deteriorated when the metal pattern is used as a metal wiring. Further, since the surface of the substrate needs to be treated with a strong acid, such as chromic acid or the like, for roughening the surface of the substrate, there has been a problem in that a complicated process is required in order to obtain a metal pattern that exhibits excellent adhesion between a metal film and a substrate.

In order to solve the above problems, a method has been proposed, which includes forming, on a substrate, a cured layer containing a polymer having a chelating ligand capable of trapping a metal ion that serves as a plating catalyst, and performing plating with respect to the cured layer (see, for example, Patent Document 1). In this method, a composition prepared by simultaneously mixing the polymer and a curing agent is used for the formation of the cured layer containing the polymer having a chelating ligand. However, the composition has a concern about stability over time thereof, and may cause a problem in that a uniform cured film cannot be obtained.

Further, in the method described in Patent Document 1, the ligands exemplified as examples of the chelating ligand include carboxylic acid type ligands represented by iminodiacetic acid, azo type ligands, polyamine type ligands, polyimine type ligands, alcoholic or phenolic hydroxyl type ligands, and β-diketone type ligands, all of which are hydrophilic. Therefore, according to this method, moisture is readily absorbed or desorbed due to variation in temperature or humidity, resulting in a problem in that the formed metal film or the substrate is distorted in shape or the metal film is readily peeled off from the substrate.

Further, using a roughening technique (for example, desmear etching) for realizing adhesion or for removing residual resins from via holes (hereinafter, may also be referred to as "via") is generally known (see, for example, Patent Document 2). However, in the case of using a metal etching method such as a subtractive method or a semi-additive method for forming a fine wiring, the roughening includes great demerits such that the adhesive force to the micronized wiring is decreased and the formation of a fine metal wiring itself is difficult since it becomes hard to remove metal residues which are incorporated in the roughened face between the wiring lines and thus, over-etching may readily occur at the time of etching.

Therefore, it is preferable that the roughened surface is smoothed, before realizing strong adhesion to a metal. However, for example, the substrate is roughened by a desmear treatment performed at the time of via formation. In production of a multilayer substrate, substrate roughening is important also in view of securing satisfactory adhesion in laminated layers including, for example, an interlayer insulating film or a solder resist. Thus, under the existing circumstances, production of a fine wiring board, only by means of merely forming a strong adhesive metal wiring on a smooth substrate surface, is difficult.

[Patent Document 1] Japanese Patent Application Laid-Open (JP-A) No. 11-12504
[Patent Document 2] JP-A No. 2001-85840

SUMMARY OF INVENTION

Technical Problem

The present invention has been made in view of the above-described disadvantages of the conventional techniques, and aims to address the following objects.

Namely, a first object of the invention is to provide a surface metal film material capable of forming, over a substrate, a metal plating layer with a strong adhesive force, even if the substrate has been subjected to a roughening treatment such that the surface roughness (Ra) of the substrate is 0.1 μm an or more, and a method of producing a surface metal film material.

Further, a second object of the invention is to provide a metal pattern material having a metal pattern, in which the metal pattern exhibits excellent adhesion to a substrate and a region where the metal pattern is not formed exhibits excellent insulation reliability, and a method of producing a metal pattern material by using the metal pattern material.

Moreover, a third object of the invention is to provide a method of producing a metal pattern material capable of securing a strong adhesion by using a metal wiring as a mask and arbitrarily roughening the exposed polymer layer, even in a case in which an interlayer insulating film or the like is laminated over a plating layer and adhesion of the interlayer insulating film or the like cannot be secured.

Solution to Problem

The present inventors have found, as a result of intensive studies on the above problems, that the above objects may be achieved by means shown below.

<1> A surface metal film material including, in this order, a substrate, a polymer layer that receives a plating catalyst or a precursor thereof, and a metal film formed by plating, wherein, when x μm represents the surface roughness (Ra) at an interface between the substrate and the polymer layer, and y μm represents the surface roughness (Ra) at an interface between the polymer layer and the metal film, $x > y$ and $5 \, \mu m > x > 0.1 \, \mu m$, and wherein, when T μm represents a thickness of the polymer layer, T and x satisfy the relationship $2x \leq T$.

<2> The surface metal film material according to the item <1>, wherein the polymer layer that receives a plating catalyst or a precursor thereof is a layer formed by coating, on the substrate, a coating liquid containing a compound having a functional group that forms an interaction with the plating catalyst or precursor thereof.

<3> The surface metal film material according to the item <1>, wherein the surface roughness (Ra) at the interface between the substrate and the polymer layer satisfies a relationship:

$$3\ \mu m > x \geq 0.8\ \mu m$$

<4> The surface metal film material according to the item <1>, wherein the surface roughness (Ra) at the interface between the polymer layer and the metal film is from 0.05 μm to 0.5 μm.

<5> A method of producing a surface metal film material, the method including: (1) preparing a polymer coating liquid containing a compound having a functional group that forms an interaction with a plating catalyst or a precursor thereof; (2) forming a polymer layer containing the compound having a functional group that forms an interaction with a plating catalyst or a precursor thereof, on a substrate, by using the coating liquid; (3) applying a plating catalyst or a precursor thereof to the polymer layer; and (4) performing plating with respect to the plating catalyst or precursor thereof to form a metal film, wherein the above-described surface roughness x and y satisfy a relationship x>y, and 5 μm>x>0.1 μm.

<6> The method of producing a surface metal film material according to the item <5>, wherein the coating liquid further contains a compound having a functional group that enhances adhesion to the substrate.

<7> The method of producing a surface metal film material according to the item <5> or <6>, wherein, when T μm represents a thickness of the polymer layer, T and x satisfy a relationship:

$$2x \leq T$$

<8> The method of producing a surface metal film material according to any one of the items <5> to <7>, wherein a surface of the substrate is formed from a resin, ceramic, glass, silicone or any composite thereof.

<9> A surface metal film material obtained by the method of producing a surface metal film material according to any one of the items <5> to <8>.

<10> A method of producing a metal pattern material, the method including etching the plating layer of the surface metal film material according to the item <9> in a patterned manner.

<11> A method of producing a metal pattern material, the method including etching the plating layer and the polymer layer of the surface metal film material according to the item <9> in a patterned manner.

<12> A metal pattern material obtained by the method of producing a metal pattern material according to the item <10> or <11>.

Advantageous Effects of Invention

According to the present invention, a surface metal film material capable of forming, over a substrate, a metal plating layer with a strong adhesive force, even if the substrate has been subjected to a roughening treatment such that the surface roughness (Ra) of the substrate is 0.1 μm or more, and a method of producing the same may be provided.

Further, a metal pattern material having a metal pattern, in which the metal pattern exhibits excellent adhesion to a substrate and a region where the metal pattern is not formed exhibits excellent insulation reliability, and a method of producing a metal pattern material by using the metal pattern material may be provided.

Moreover, a method of producing a metal pattern material capable of securing a strong adhesion by using a metal wiring as a mask and arbitrarily roughening the exposed polymer layer, even in a case in which an interlayer insulating film or the like is laminated over a plating layer and adhesion of the interlayer insulating film or the like cannot be secured, may be provided.

DESCRIPTION OF EMBODIMENTS

Hereinafter, the present invention is explained in detail.

In the present invention, the surface roughness (Ra) is Ra value defined in JIS B0601 (revised Jan. 20, 2001), by a non-contact interference method, and refers to Ra obtained by measuring a surface of a substrate or the like using SURF-COM 3000A (manufactured by Tokyo Seimitsu Co., Ltd).

Further, the surface roughness (x and y) at an interfaces are values measured by observing a cross-section thereof using SEM (a scanning electron microscope), and each arithmetic average roughness is measured in accordance with JIS B0633-2001.

<Surface Metal Film Material, Method of Producing the Same, and Method of Producing Metal Pattern Material>

The surface metal film material of the present invention is characterized in that it has, in this order, a substrate, a polymer layer that receives a plating catalyst or a precursor thereof, and a metal film formed by plating, wherein, when x μm represents the surface roughness (Ra) at an interface between the substrate and the polymer layer, and y μm represents the surface roughness (Ra) at an interface between the polymer layer and the metal film, x>y, and 5 μm>x>0.1 μm.

By having such a configuration, the interface between a roughened face of the substrate and the polymer layer may be adhered due to the incorporation of the polymer layer into the roughened face, and further, the polymer layer may adhere strongly to the plated metal film due to permeation of a portion of plating metals into the polymer layer.

The method of producing a surface metal film material of the present invention includes: (1) preparing a polymer coating liquid containing a compound having a functional group that forms interaction with a plating catalyst or a precursor thereof; (2) forming a polymer layer containing the compound having a functional group that forms interaction with a plating catalyst or a precursor thereof, on a substrate, by using the coating liquid; (3) applying a plating catalyst or a precursor thereof to the polymer layer; and (4) performing plating with respect to the plating catalyst or precursor thereof to form a metal film.

The method of producing a metal pattern material of the present invention is characterized in that the method includes (5) etching the plated film of the surface metal film material of the present invention (the surface metal film material obtained by the method of producing a surface metal film material of the present invention) in a patterned manner, or (6) etching the plated layer and the polymer layer of the surface metal film material of the present invention in a patterned manner.

Specifically, the method of producing a metal pattern material is a method of performing processes (1) to (4) in the above-described method of producing a surface metal film material, and then performing a process of etching the formed plated film, in a patterned manner [process (5)], or a process of etching the plated film and the polymer layer in a patterned manner [process (6)].

The surface metal film material of the present invention, as well as the method of producing the same, and the method of producing a metal pattern material, include a polymer layer containing a compound having a functional group that forms interaction with a plating catalyst or a precursor thereof. Further, at least one of components contained in a coating liquid that is used for forming the above polymer layer has a non-dissociative functional group (hereinafter, may appropriately be referred to as an "interactive group"), that forms interaction with the plating catalyst or precursor thereof. By applying the plating catalyst or the like to the polymer layer and then, performing plating using the same, a metal film that exhibits excellent adhesion to the polymer layer can be obtained.

Further, when a substrate having a polymerization initiation layer is used, the polymer layer can be directly chemically bonded to the substrate and thus, a metal film that exhibits more excellent adhesion to the substrate can be obtained.

In view of the above, the surface metal film material and metal pattern thus obtained may have a metal film that exhibits excellent adhesion to the substrate.

Furthermore, in the formation of the polymer layer according to the present invention, the coating liquid formed in process (1) can maintain the stability over time of the coating liquid when the coating liquid is prepared immediately before process (2), and as a result of which, a polymer layer having in-plane uniformity can be formed. As a result, a metal film or metal pattern which is formed on the polymer layer can obtain adhesion to the substrate and in-plane uniformity.

As described above, the polymer layer according to the present invention is formed by using a monomer or a polymer, each of which is a compound containing an interactive group. Since the interactive group that exists in this polymer layer is a non-dissociative functional group, the polymer layer may become a layer having excellent interactive properties with respect to the plating catalyst or precursor thereof, as well as having a low water absorbing property even under the conditions of high temperature and high humidity, and having a high hydrophobicity.

In view of the above, the surface metal film material thus obtained has a metal film that exhibits excellent adhesion to the substrate. Such a surface metal film material can be applied to the method of producing a metal pattern material described below or the like, can be used for electrical wiring materials, and further, can be used for electromagnetic wave protective films, shielding materials, or the like.

In the method of producing a metal pattern material, a metal pattern is obtained by etching the plated film that has been formed on the entire surface of the substrate in a patterned manner or by etching the plated film and the polymer layer in a patterned manner, in process (5) or process (6). In this case, even if an exposed heat melt layer is formed at a non-formation region of the thus obtained metal pattern, the exposed portion does not absorb water, and deterioration in insulating properties due to the absorption of water does not occur. As a result, the metal pattern material formed by the method of producing a metal pattern material of the present invention exhibits excellent insulation reliability in the non-formation region of the metal pattern.

In the following, preferable methods of producing a surface metal film material according to the present invention are described in detail. However, it is enough that the surface metal film material of the present invention basically has, in this order, a substrate, a polymer layer that receives a plating catalyst or a precursor thereof, and a metal film formed by plating, and the surface roughness x and y satisfy a relationship $x>y$, and $5 \ \mu m > x > 0.1 \ \mu m$.

The present invention is not limited to the following methods.

Each of processes (1) to (4) in the method of producing a surface metal film material of the present invention is explained.

[Process (1)]

In process (1) in the method of producing a surface metal film material of the present invention, a polymer coating liquid containing a compound having a functional group that forms interaction with a plating catalyst or a precursor thereof is prepared.

The coating liquid used in this process contains a polymer as an essential component, but may contain a monomer and/or other components. At least one of the polymer, the monomer, or the other components, each of which forms the coating liquid, has a non-dissociative functional group that forms interaction with a plating catalyst or a precursor thereof.

<Combination of Polymer, Monomer, and Interactive Group-Containing Compound>

Hereinafter, a combination of a polymer, a monomer, and an interactive group-containing compound, which is used in the present invention, is explained. Here, the term "interactive group-containing compound" encompasses at least one of a polymer having an interactive group or a monomer having an interactive group.

Note that, the polymer used in the present invention may not contain a polymerizable group, from the viewpoint of stability over time of the coating liquid. However, the present invention is not limited to the embodiment of not containing a polymerizable group.

<<Combination in Method of Producing Surface Metal Film Material>>

In the method of producing a surface metal film material of the present invention, a polymer having an interactive group or a polymer that does not have an interactive group is used in process (1). These polymers are used, for example, in the following embodiments.

(i) A single use of a polymer having an interactive group (ii) A combination use of a polymer having an interactive group and a monomer that does not have an interactive group (iii) A combination use of a polymer that does not have an interactive group and a monomer having an interactive group (iv) A combination use of a polymer having an interactive group and a monomer having an interactive group Among the above embodiments, (iv) is preferable from the viewpoint of deposition property in plating.

Firstly, the "interactive group" in the present invention is explained.

The interactive group in the present invention is not limited as long as the interactive group has a function of forming interaction with a plating catalyst or a precursor thereof. Specific examples thereof include a dissociative functional group which generates a proton by dissociation under the basic condition and is capable of adsorption through an ionic bond with a metal ion, and a non-dissociative functional group such as a functional group which does not generate a proton by dissociation, namely, a group having an ability of forming multidentate coordination, a nitrogen-containing functional group, a sulfur-containing functional group, or an oxygen-containing functional group.

Examples of the dissociative functional group include a carboxylic group, a sulfonic acid group, a phosphoric acid group, and a boronic acid group.

Preferable examples of the non-dissociative functional group include, specifically, a group capable of forming coordination with a metal ion, a nitrogen-containing functional group, a sulfur-containing functional group, and an oxygen-containing functional group. Specific examples thereof include a nitrogen-containing functional group such as an imido group, a pyridine group, a tertiary amino group, an ammonium group, a pyrrolidone group, an amidino group, a triazine ring, a triazole ring, a benzotriazole group, a benzimidazole group, a quinoline group, a pyrimidine group, a pyrazine group, a nazoline group, a quinoxaline group, a purine group, a triazine group, a piperidine group, a piperazine group, a pyrrolidine group, a pyrazole group, an aniline group, a group containing an alkylamine group structure, a group containing an isocyanuric structure, a nitro group, a nitroso group, an azo group, a diazo group, an azido group, a cyano group, or a cyanate group (R—O—CN); an oxygen-containing functional group such as a hydroxy group, a carbonate group, an ether group, a carbonyl group, an ester group, a group containing an N-oxide structure, a group containing an S-oxide structure, or a group containing an N-hydroxy structure; a sulfur-containing functional group such as a thiophene group, a thiol group, a thiocyanuric acid group, a benzothiazole group, a mercaptotriazine group, a thioether group, a thioxy group, a sulfoxide group, a sulfone group, a sulfite group, a group containing a sulfoxyimine structure, a group containing a sulfoxynium salt structure, or a group containing a sulfonate structure; a phosphorus-containing functional group such as a phosphate group, a phosphoroamido group, or a phosphine group; a group containing a halogen atom such as chlorine or bromine; and an unsaturated ethylene group. Further, as far as the embodiment exhibits non-dissociation property in relation with adjacent atoms or atomic groups, an imidazole group, a urea group, or a thiourea group may be used. Furthermore, for example, a functional group derived from a compound having inclusion ability such as cyclodextrin or crown ether may be used.

It is preferable to use such a non-dissociative functional group in view of reducing the water absorbing property or hygroscopic property of the cured layer. Among them, from the viewpoints of higher polarity and higher adsorptivity to the plating catalyst or the like, an ether group (more specifically, a structure represented by —O—$(CH_2)_n$—O— (n represents an integer of from 1 to 5)) or a cyano group is particularly preferable, and a cyano group is most preferable.

In general, as the polarity gets higher, the water absorption rate tends to get higher. However, since a cyano group interacts with other cyano groups so as to cancel the polarity of each other in the cured layer, the film becomes dense and the polarity of the polymer layer as a whole decreases, whereby the water absorbing property gets lower. Further, when the catalyst is adsorbed using a good solvent used for the polymer layer, the cyano groups are solvated and interaction between the cyano groups is canceled, thereby enabling the cyano groups to interact with the plating catalyst. For the reasons described above, the polymer layer having a cyano group is preferable in view of achieving both of contradictory properties of low moisture absorption and satisfactory interaction with the plating catalyst.

The interactive group in the present invention is more preferably a cyanoalkyl group. The reason for the above is as follows. In an aromatic cyano group, electrons are attracted to the aromatic ring, and thus, the donating property of unpaired electrons that play an important role for the adsorptivity to a plating catalyst or the like may be decreased. In contrast, in a cyanoalkyl group, such an aromatic ring is not bonded thereto. Therefore, a cyanoalkyl group is preferable from the viewpoint of the adsorptivity to a plating catalyst or the like.

The polymer that does not have an interactive group, which may be used in process (1) in the method of producing a surface metal film material of the present invention, is not particularly limited.

The polymer is roughly classified into the following groups: (A) a resin capable of curing a polymer layer after coating, by means of light or heat; and (B) a resin that forms a polymer layer by coating a resin solution diluted with a diluting agent or the like, or an emulsion type resin coating liquid, followed by drying.

The (A) resin capable of curing a polymer layer after coating by means of light or heat may be either of a linear polymer or a crosslinking polymer, after performing curing. With regard to (B), in the case of a crosslinking resin, since crosslinking resins are generally hard to dissolve by using a diluting agent or the like, it is preferable to perform coating and drying using an emulsion type resin coating liquid. It is more preferable that (B) is a linear polymer. Examples of such a resin, which can be used, include a resin group represented by the following classifications. Namely, a phenol resin (PF), an epoxy resin (EP), a melamine resin (MF), a urea resin (UF), an unsaturated polyester resin (UP), an alkyd resin, polyurethane (PUR), solvent-soluble polyimide (PI), polyethylene (PE), high density polyethylene (HDPE), medium density polyethylene (MDPE), low density polyethylene (LDPE), polypropylene (PP), polyvinyl chloride (PVC), polyvinylidene chloride, polystyrene (PS), polyvinyl acetate (PVAc), polytetrafluoroethylene (PTFE), an ABS resin (an acrylonitrile-butadiene-styrene resin), an AS resin, an acrylic resin, polyamide (PA), nylon, polyacetal (POM), polycarbonate (PC), modified polyphenylene ether (m-PPE, modified PPE, or PPO), polybutylene terephthalate (PBT), polyethylene terephthalate (PET), glass fiber reinforced polyethylene terephthalate (GF-PET), cyclic polyolefin (COP), polyphenylene sulfide (PPS), polytetrafluoroethylene (PTFE), polysulfone (PSF), polyether sulfone (PES), amorphous polyarylate (PAR), solvent-soluble liquid crystal polymer (LCP), polyether ether ketone (PEEK), thermoplastic polyimide (PI), polyamideimide (PAI), and the like.

Among them, a phenol resin, an epoxy resin, a melamine resin, a urea resin, an unsaturated polyester resin, an alkyd resin, polyurethane, solvent-soluble polyimide, polystyrene, polyvinyl acetate, an ABS resin, an AS resin, an acrylic resin, nylon, polyacetal, polycarbonate, and a solvent-soluble liquid crystal polymer are preferable. By incorporating a compound having an interactive group, with respect to the resin group, a function of the polymer layer used in the present invention may be realized.

By taking into consideration adsorptivity of the polymer layer to the plating catalyst or adhesive force between a plated film and the polymer layer, a polymer which has sufficient flexibility and has an acrylic structure in the main chain (an acrylic resin) is preferable. Specific examples of the polymer include polyalkyl acrylates such as poly(methyl acrylate), poly(ethyl acrylate), poly(n-butyl acrylate), poly(t-butyl acrylate), poly(pentyl acrylate), and poly(2-ethylhexyl acrylate).

On the other hand, the polymer which is used in process (1) in the method of producing a surface metal film material of the present invention may be a polymer having an interactive group as described above. In the present invention, an acrylic resin is preferably used in terms of effectively imparting adsorptivity of the polymer layer to the plating catalyst or the like, or adhesion between the plating film and the polymer layer, and also improving flexibility of the polymer layer.

Specifically, a polymer obtained by introducing the above-described interactive group into the acrylic resin is preferable. More specifically, homopolymers or copolymers which are formed by using a monomer having a cyano group as shown below are preferable.

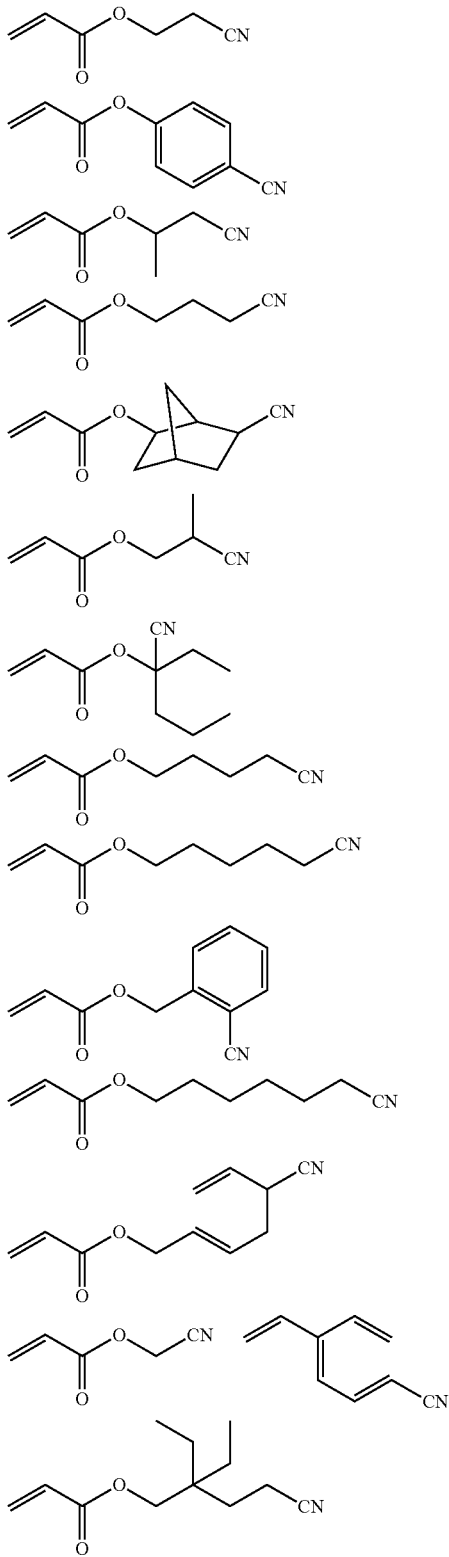

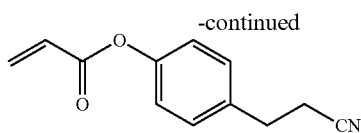

In process (1) in the method of producing a surface metal film material of the present invention, it is preferable to use a polymer having an interactive group from the viewpoint of introducing more interactive groups into the polymer layer. For the purpose of introducing an interactive group into the polymer layer, a method of using a monomer having an interactive group as described above can also be described. However, since the monomer is a low molecular weight component, when the monomer has not been reacted, there is a possibility that the unreacted monomer may be removed during development or the like. In contrast, since the polymer having an interactive group is a high molecular weight component, the polymer is less likely to be removed. Accordingly, in the case of using a polymer having an interactive group, it is possible to introduce more interactive groups into the polymer layer.

Further, it is preferable to use a polymer having an interactive group and a monomer having an interactive group in combination, from the viewpoint of introducing more interactive groups into the polymer layer.

In the method of producing a surface metal film material of the present invention, a monomer that does not have an interactive group may be used in combination with a monomer having an interactive group or a polymer having an interactive group, in the coating liquid.

The monomer that does not have an interactive group, which may be added to the coating liquid in the method of producing a surface metal film material of the present invention, is not particularly limited as long as the monomer is a radical polymerizable compound having at least one ethylenically unsaturated double bond and does not have an interactive group.

The monomer that does not have an interactive group is selected from compounds having at least one, preferably two or more, of an ethylenically unsaturated double bond at a terminal. In the present invention, a polyfunctional monomer having two or more radically polymerizable groups is preferable from the viewpoint of reactivity. Such a compound group is widely known in the field of the art, and any of these polymerizable compounds may be used without any particular limitation in the present invention. Examples of the monomer include unsaturated carboxylic acids (for example, acrylic acid, methacrylic acid, itaconic acid, crotonic acid, isocrotonic acid, maleic acid, and the like), esters thereof, and amides. Preferably, an ester of an unsaturated carboxylic acid and an aliphatic polyhydric alcohol compound, or an amide formed from an unsaturated carboxylic acid and an aliphatic polyvalent amine compound is used. Further, an addition reaction product of an ester or amide of an unsaturated carboxylic acid having a nucleophilic substituent such as a hydroxyl group, an amino group, or a mercapto group and a monofunctional or polyfunctional isocyanate or epoxy, a dehydration condensation reaction product of an ester or amide of an unsaturated carboxylic acid having a nucleophilic substituent such as a hydroxy group, an amino group, or a mercapto group and a monofunctional or polyfunctional carboxylic acid, or the like is also preferably used. Furthermore, an addition reaction product of an ester or amide of an unsaturated carboxylic acid having an electrophilic substituent such as an isocyanate group or an epoxy group and a monofunctional or polyfunctional alcohol, amine, or thiol, and further, a substitution reaction product of an ester or amide of an unsaturated carboxylic acid having an elimination substituent such as a halogen group or a tosyloxy group and a monofunctional or polyfunctional alcohol, amine, or thiol are also preferable. As another example, a group of compounds in which the above unsaturated carboxylic acid is replaced with an unsaturated phosphonic acid, styrene, or the like is also applicable.

Specific examples of the radically polymerizable compound, which is an ester of an aliphatic polyhydric alcohol compound and an unsaturated carboxylic acid are described below. Examples of acrylates include ethylene glycol diacrylate, 1,3-butanediol diacrylate, propylene glycol diacrylate, neopentyl glycol diacrylate, trimethylolpropane triacrylate, trimethylolethane triacrylate, hexanediol diacrylate, 1,4-cyclohexanediol diacrylate, pentaerythritol tetraacrylate, dipentaerythritol hexaacrylate, sorbitol hexaacrylate, and a polyester acrylate oligomer.

Examples of methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol tetramethacrylate, dipentaerythritol hexamethacrylate, and sorbitol hexamethacrylate.

Examples of itaconates include ethylene glycol diitaconate, propylene glycol diitaconate, 1,3-butanediol diitaconate, 1,4-butanediol diitaconate, tetramethylene glycol diitaconate, pentaerythritol tetraitaconate, and sorbitol hexaitaconate.

Examples of crotonates such include ethylene glycol dicrotonate, tetramethylene glycol dicrotonate, pentaerythritol tetracrotonate, and sorbitol hexadicrotonate.

Examples of isocrotonates such include ethylene glycol diisocrotonate, pentaerythritol tetraisocrotonate, and sorbitol hexaisocrotonate.

Examples of maleates include ethylene glycol dimaleate, triethylene glycol dimaleate, pentaerythritol tetramaleate, and sorbitol hexampleate.

Other examples of the ester, which may be also favorably used, include aliphatic alcohol esters described in Japanese Patent Examined Application Publication (JP-B) Nos. 46-27926 and 51-47334, and JP-A No. 57-196231, esters having an aromatic skeleton described in JP-A Nos. 59-5240, 59-5241, and 2-226149, and esters described in JP-A No. 1-165613.

Specific examples of an amide monomer formed from an aliphatic polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide.

Other preferable examples of the amide monomer may include amide monomers having a cyclohexylene structure described in JP-B No. 54-21726.

Further, a urethane based addition polymerizable compound that is produced by using an addition reaction between isocyanate and a hydroxyl group is also preferable. Specific examples thereof include a vinyl urethane compound having two or more polymerizable vinyl groups in one molecule, which is obtained by adding a hydroxyl group-containing vinyl monomer represented by the following Formula (a) to a polyisocyanate compound having two or more isocyanate groups in one molecule, as described in JP-B No. 48-41708.

$$CH_2=C(R)COOCH_2CH(R')OH \qquad \text{Formula (a)}$$

wherein, in Formula (a), each of R and R' independently represents H or $CH_3$.

The monomer having an interactive group which is to be added to the coating liquid in the method of producing a surface metal film material of the present invention is not particularly limited as long as the monomer is a radically polymerizable compound having at least one ethylenically unsaturated double bond and has an interactive group.

Specifically, a monomer obtained by introducing the above-described interactive group (a non-dissociative functional group) into a monomer that does not have an interactive group, as described above, by substitution is used. More specifically, a monomer having a cyano group, which is used in the synthesis of the above-described polymer having an interactive group is preferable.

Further, an interactive group-containing reactive compound can be also added to the coating liquid. The interactive group-containing reactive compound means a compound having the above-described interactive group and a reactive group capable of forming a covalent bond by reacting with a monomer or a polymer. Examples of such a compound include the following compounds.

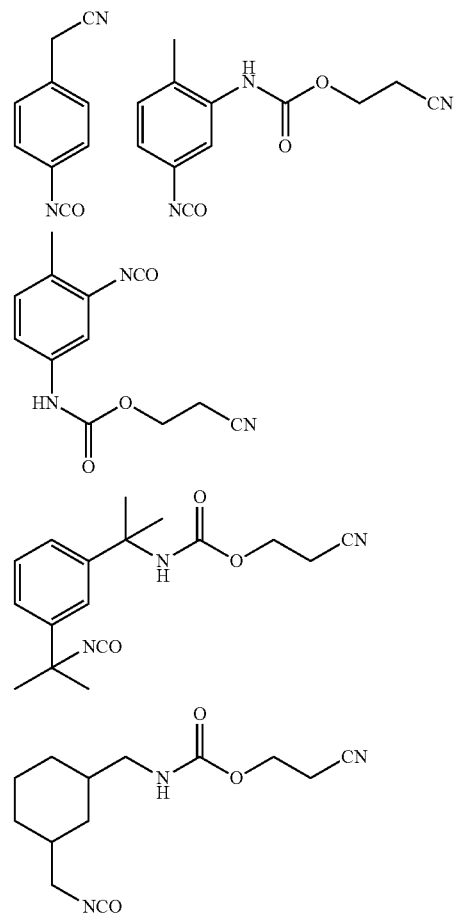

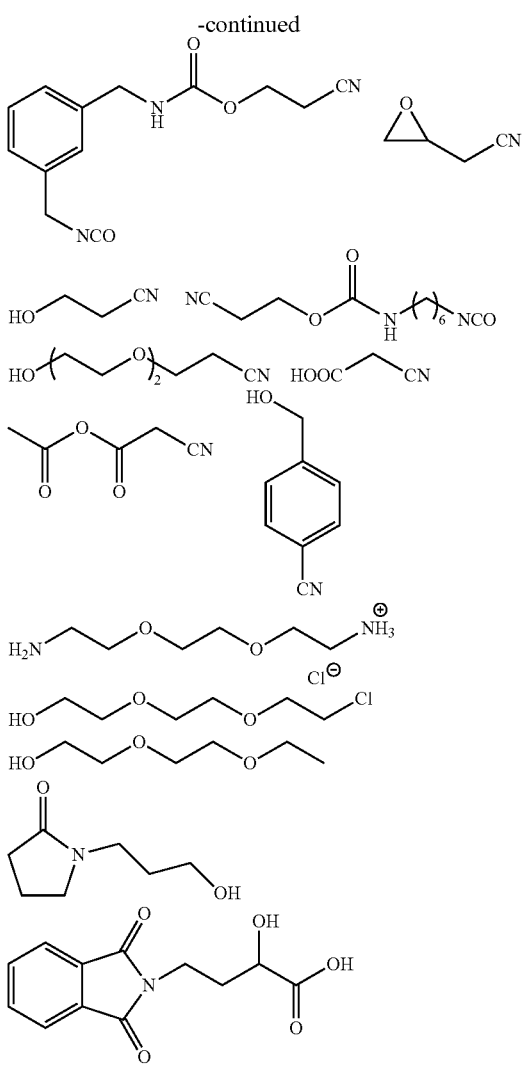

Examples of a combination of the reactive group in the interactive group-containing reactive compound and the functional group which is contained in the polymer and/or the monomer and reacts with the reactive group in the interactive group-containing reactive compound include the following combinations.

Namely, the combination of (Functional group which is contained in the polymer and/or monomer and reacts with the reactive group in the interactive group-containing reactive compound, Reactive group in the interactive group-containing reactive compound)=(—COOH, amine), (—COOH, aziridine), (—COOH, isocyanate), (—COOH, epoxy), (—NH$_2$, isocyanate), (—NH$_2$, an aldehyde), (—NCO, amine), (—NCO, isocyanate), (—NCO, alcohol), (—NCO, epoxy), (—OH, alcohol), (—OH, a halogenated compound), (—OH, amine), (—OH, acid anhydride), and (—OH, isocyanate). Among them, from the viewpoint of high reaction efficiency, the combination of (Functional group, Reactive group)=(—OH, isocyanate) is preferable.

The concentration of the polymer in the coating liquid prepared in this process is preferably from 1% by mass to 30% by mass, and more preferably from 5% by mass to 20% by mass, from the viewpoint of coating ability.

Regarding the conditions for preparing the coating liquid, it is preferable to add the component by dissolving it with a solvent (in the form of a solution). In this case, it is preferable that the solution is prepared so as to have higher concentration than an intended concentration of the coating liquid (mixed liquid). Alternatively, when the storage stability of a concentrated coating liquid is poor, it is possible to dilute the coating liquid to such a concentration that favorable storage stability can be realized, and adjust the concentration by evaporating the solvent immediately before the coating.

Regarding the conditions for preparing the coating liquid, it is preferable to add the monomer that has or does not have the above-described interactive group and the interactive group-containing compound in the form of a solution. In this solution, the total content of the above monomer and the interactive group-containing compound is preferably from 10% by mass to 50% by mass.

Note that, the solvent used herein for preparing the solution including the above monomer and the interactive group-containing compound, and the solvent used for preparing the coating liquid may be the same or may be different from each other.

In a case in which the above monomer and the interactive group-containing compound are added to prepare the coating liquid, it is preferable to use this coating liquid for coating without aging. The coating liquid should be used up within one week from the preparation thereof.

In the coating liquid, the addition proportion of the monomer should be from 30% by mass to 200% by mass with respect to the mass of the polymer that has or does not have an interactive group. When the addition proportion is less than 30% by mass, curing of the film may not be sufficiently carried out. When the addition proportion is more than 200% by mass, the film after coating becomes sticky and difficult to handle, and the crosslinking ratio of the film after curing is increased so that adsorption of the plating catalyst or the like is less likely to occur in the subsequent process. The addition proportion of the monomer is more preferably from 30% by mass to 130% by mass, and most preferably from 30% by mass to 100% by mass, with respect to the mass of the polymer.

Further, the addition ratio of the monomer is preferably such that the ratio of the polymerizable group per 1 g of the film that has been formed by coating the coating liquid and drying is 2.0 mmol/g or more, and more preferably 4.0 mmol/g. When the ratio is less than 2.0 mmol/g, there are cases in which a sufficient curability is not obtained.

Furthermore, it is preferable that the interactive group is incorporated at a ratio of 2.0 mmol/g or more per 1 g of the film (polymer layer) that has been formed by coating the coating liquid and drying, and it is more preferable that the ratio is 3.0 mmol/g or more.

A photopolymerization initiator can be added to the coating liquid in order to enhance the curability. The photopolymerization initiator is not particularly limited as long as the photopolymerization initiator is a compound which is active with respect to the actinic rays to be irradiated and generates active species. For example, a radical polymerization initiator, an anionic polymerization initiator, a cationic polymerization initiator, or the like can be used. From the viewpoints of ease of handling and reactivity, a radical polymerization initiator and a cationic polymerization initiator are preferable, and a radical polymerization initiator is more preferable.

Specific examples of such a photopolymerization initiator include acetophenones such as p-tert-butyltrichloroacetophenone, 2,2'-diethoxyacetophenone, and 2-hydroxy-2-methyl-1-phenylpropan-1-one; ketones such as benzophenone (4,4'-bisdimethylaminobenzophenone, 2-chlorothioxanthone, 2-methylthioxanthone, 2-ethylthioxanthone, and 2-isopropylthioxanthone; benzoin ethers such as benzoin, benzoin methyl ether, benzoin isopropyl ether, and benzoin isobutyl ether; benzyl ketals such as benzyl dimethyl ketal and hydroxycyclohexyl phenyl ketone; sulfonium salts such as triphenylsulfonium chloride and triphenylsulfonium pentafluorophosphate; and iodonium salts such as diphenyliodonium chloride and diphenyliodonium sulfate.

The content of the polymerization initiator is preferably in a range of from 0.1% by mass to 30% by mass, and particularly preferably in a range of from 1% by mass to 20% by mass, with respect to the total solids in the coating liquid.

[Process (2)]

In process (2) in the method of producing a surface metal film material of the present invention, a polymer layer is formed by coating a coating liquid on the substrate and then drying the coating liquid.

In this process, coating with the coating liquid is performed by using a known coating method such as spin coating, bar coating, coater coating, dip coating, or spray coating.

The coating amount is preferably from 0.1 µm to 5 µm, and more preferably from 0.5 µm to 2 µm, in terms of the film thickness that has been dried.

It is preferable that the surface roughness and a thickness of the polymer layer satisfy a relationship of: $2x \leq T$, wherein T µm represents a thickness of the polymer layer that has been dried, and x µm represents the surface roughness (Ra) at an interface between the substrate described below and the polymer layer. It is more preferable that x and T satisfy a relationship of: $2.5x \leq T$. When x and T satisfy the above relationship, adhesive force between the substrate and the polymer layer becomes higher and the surface becomes smoother, which is more preferable.

The drying temperature after coating is preferably from 50° C. to 150° C., and more preferably from 70° C. to 100° C. The drying time is preferably from 1 minute to 1 hour, and more preferably from 1 minute to 10 minutes.

[Curing Process]

An embodiment of curing the polymer layer obtained in the above process (2) to form a cured layer on the substrate is also preferable. Hereinafter, the curing process is described.

The polymer layer obtained after drying is cured by applying energy by means of heating, light exposure, or the like.

The application of energy may be conducted by using, for example, radiation irradiation such as heating or light exposure. For example, light irradiation using a UV lamp, visible rays, or the like, or heating using a hot plate or the like is applicable. Examples of the light source include a mercury lamp, a metal halide lamp, a xenon lamp, a chemical lamp, and a carbon arc lamp. Examples of the radiation rays include electron beam, X ray, ion beam, and far-infrared ray. Further, g line, i line, deep-UV light, and high density energy beam (laser beam) are also applicable.

Specific favorable embodiments, which are generally used, include: direct imagewise recording using a thermal recording head or the like; scanning exposure using infrared laser, high-illuminance flash exposure using a xenon discharge lamp; and infrared lamp exposure.

Although it depends on the curing property of the intended film and the light source, the time needed for the application of energy is usually in a range of from 10 seconds to 5 hours.

[Substrate]

Next, the substrate used in the present invention is described.

It is enough that the substrate in the present invention has a shape retaining property. A substrate whose surface has been roughened is preferable from the viewpoint of obtaining physical adhesion between the substrate and the polymer layer to which plating is to be performed. Further, it is more preferable that the surface of the substrate has reactivity in the formation of the polymer layer and a function of forming a chemical bond, in a case in which the polymer layer is cured.

(Base Material and Substrate)

The base material used in the present invention is preferably a dimensionally stable plate-shaped substance, and examples thereof include paper, paper laminated with a plastic (for example, polyethylene, polypropylene, polystyrene, or the like), a plate of a metal (for example, aluminum, zinc, copper, or the like), a film of a plastic (for example, cellulose diacetate, cellulose triacetate, cellulose propionate, cellulose butyrate, cellulose acetate, cellulose nitrate, polyethylene terephthalate, polyethylene, polystyrene, polypropylene, polycarbonate, polyvinyl acetal, polyimide, epoxy, a bismaleimide resin, polyphenylene oxide, a liquid crystal polymer, polytetrafluoroethylene, or the like), and paper or a plastic film onto which a metal is laminated or deposited.

A substrate in which the surface of the base material is formed from a resin, ceramic, glass, silicone, or any composite thereof is preferable. Not only the surface, but also the whole of a substrate may be formed from a resin, ceramic, glass, silicone, or a composite thereof.

A base material including polyamide that has a polymerization initiation site in a skeleton thereof, as described in paragraphs [0028] to [0088] of JP-A No. 2005-281350 can also be used for the substrate in the present invention.

The metal pattern material obtained by the method of producing a metal pattern material of the present invention can be applied to semiconductor packages, various electrical wiring boards, or the like. In the case of using the metal pattern material for such applications, it is preferable to use a substrate formed from an insulating resin, as shown below.

Specifically, the substrate formed from an insulating resin is preferably a substrate formed from an insulating resin having a dielectric constant (relative dielectric constant) at 1 GHz of 3.5 or less, or a substrate having a layer formed from the above insulating resin, provided on a base material. Further, the substrate formed from an insulating resin is preferably a substrate formed from an insulating resin having a dielectric loss tangent at 1 GHz of 0.01 or less, or a substrate having a layer formed from the above insulating resin, provided on a base material.

The dielectric constant and dielectric loss tangent of an insulating resin can be measured by ordinary methods. For example, the measurement can be performed using a cavity resonator perturbation method (for example, an ultra thin sheet ∈r and tan δ measuring device, manufactured by Keycom Corporation), based on the method described in "Proceedings of the 18th Academic Lecture Meeting of Japan Institute of Electronics Packaging", 2004, page 189.

In the present invention, in a case in which the substrate is a plate-shaped substance, for example, a resin film (plastic film), a heat melt layer may be formed on the both sides of the resin film.

In a case in which a polymer layer is formed on the both sides of a resin film (substrate) as described above, by further conducting process (3) and process (4) described below, a surface metal film material in which a metal film is formed on the both sides of the substrate can be obtained.

[Process (3)]

In process (3), a plating catalyst or a precursor thereof is applied to the polymer layer formed in process (2) above. In this process, the applied plating catalyst or precursor thereof adheres (is adsorbed) to the interactive group that exists in the polymer layer, according to the function of the interactive group.

Here, examples of the plating catalyst or precursor thereof include those that function as a catalyst or an electrode for plating in plating process (4) described below. Therefore, the type of the plating catalyst or precursor thereof may be determined according to the type of plating performed in plating process (4).

Here, the plating catalyst or precursor thereof used in this process is preferably an electoless plating catalyst or a precursor thereof.

(Electoless Plating Catalyst)

As an electoless plating catalyst used in the present invention, any compound may be used as long as the compound serves as an active nucleus at the time of electoless plating. Specific examples include metals having a catalytic ability for a self-catalytic reduction reaction. Specific examples include Pd, Ag, Cu, Ni, Al, Fe, and Co. Among them, those capable of multidentate coordination are preferable, and particularly, Ag and Pd are particularly preferable in view of the number of types of functional groups capable of coordination and the superiority in the catalytic ability.

The electoless plating catalyst may be used in the form of a metal colloid. Generally, a metal colloid can be prepared by reducing metal ions in a solution containing a charged surfactant or a charged protective agent. The electrical charge of the metal colloid may be adjusted by the surfactant or protective agent used herein.

(Electoless Plating Catalyst Precursor)

The electoless plating catalyst precursor used in this process can be used without any particular limitation as long as the electoless plating catalyst precursor can serve as a electoless plating catalyst by a chemical reaction. Mainly, a metal ion of a metal described above as the electoless plating catalyst is used. A metal ion that serves as an electoless plating catalyst precursor becomes a zero-valent metal that serves as an electoless plating catalyst through a reduction reaction. A metal ion that serves as an electoless plating catalyst precursor may be converted into a zero-valent metal to obtain an electoless plating catalyst by performing a special reduction reaction during a period after application to the polymer layer but before immersion into an electoless plating bath, or the electoless plating catalyst precursor may be immersed in an electoless plating bath as it is, thereby converting the electoless plating catalyst precursor into a metal (electoless plating catalyst) by means of a reducing agent contained in the electoless plating bath.

Practically, the metal ion which serves as an electoless plating catalyst precursor is applied onto a cured layer by using a metal salt. The metal salt which may be used is not particularly limited as long as the metal salt dissolves in an appropriate solvent to dissociate into a metal ion and a base (anion). Examples thereof include $M(NO_3)_n$, $MCl_n$, $M_{2/n}(SO_4)$, and $M_{3/n}(PO_4)$ (wherein M represents a metal atom having a valency of n). As the metal ion, those obtained through dissociation of the above metal salts may be preferably used. Specific examples of the metal ion include an Ag ion, a Cu ion, an Al ion, an Ni ion, a Co ion, an Fe ion, and a Pd ion. Among them, those capable of multidentate coordination are preferable, and particularly, an Ag ion and a Pd ion are preferable in view of the number of types of functional groups capable of coordination and the catalytic ability.

One preferable example of the electoless plating catalyst or precursor thereof used in the present invention is a palladium compound. The palladium compound acts as a plating catalyst (palladium) or a precursor thereof (palladium ion), which serves as an active nucleus at the time of plating treatment and plays a role in deposition of a metal. The palladium compound is not particularly limited as long as the compound contains palladium and functions as a nucleus at the time of plating treatment, and examples thereof include palladium (II) salts, palladium (0) complexes, and palladium colloid.

Examples of the palladium salts include palladium acetate, palladium chloride, palladium nitrate, palladium bromide, palladium carbonate, palladium sulfate, bis(benzonitrile)dichloropalladium (II), bis(acetonitrile)dichloropalladium (II), and bis(ethylenediamine)palladium (II) chloride. Among them, from the viewpoints of ease in handling and solubility, palladium nitrate, palladium acetate, palladium sulfate, and bis(acetonitrile)dichloropalladium (II) are preferable.

Examples of the palladium complexes include tetrakis[tri(phenyl)phosphine] palladium complex and tris(benzylideneacetone) dipalladium complex.

The palladium colloid includes particles formed from palladium (0). Although the size of the particle is not particularly limited, the particle size is preferably from 5 nm to 300 nm, and more preferably from 10 nm to 100 nm, from the viewpoint of stability in a liquid. The palladium colloid may contain other metal, as necessary. Examples of the other metal include tin and the like. Examples of the palladium colloid include tin-palladium colloid and the like. The palladium colloid may be synthesized according to a known method, or a commercially available product may be used. For example, the palladium colloid can be prepared by reducing a palladium ion in a solution containing a charged surfactant or a charged protective agent.

(Organic Solvent and Water)

The plating catalyst or the precursor as described above is applied to the layer to be subjected to plating, in the form of a dispersion liquid or a solution (catalyst liquid), as described above.

An organic solvent or water is used in the catalyst liquid according to the present invention.

When an organic solvent is contained in the catalyst liquid as described above, the permeability of the plating catalyst or the precursor into the layer to be subjected to plating may be improved, and the plating catalyst or precursor thereof may be effectively adhered to the interactive group.

Water may be used in the catalyst liquid according to the present invention. It is preferable that the water used herein does not contain impurities, and from this point of view, it is preferable to use RO water, deionized water, distilled water, or purified water, and it is particularly preferable to use deionized water or distilled water.

The organic solvent used for preparing the plating catalyst liquid is not particularly limited as long as the organic solvent is a solvent capable of permeating into the layer to be subjected to plating. Specific examples of the organic solvent, which may be used, include acetone, methyl acetoacetate, ethyl acetoacetate, ethylene glycol diacetate, cyclohexanone, acetylacetone, acetophenone, 2-(1-cyclohexenyl), propylene glycol diacetate, triacetin, diethylene glycol diacetate, dioxane, N-methylpyrrolidone, dimethylcarbonate, and dimethyl cellosolve.

Other examples of the organic solvent include diacetone alcohol, γ-butyrolactone, methanol, ethanol, isopropyl alcohol, normal-propyl alcohol, propylene glycol monomethyl ether, methyl cellosolve, ethyl cellosolve, ethylene glycol tertiary-butyl ether, tetrahydrofuran, 1,4-dioxane, and n-methyl-2-pyrrolidone.

Particularly, from the viewpoints of mutual solubility with the plating catalyst or precursor thereof and permeability into the layer to be subjected to plating, a water-soluble organic solvent is preferable, and specifically, acetone, dimethylcarbonate, dimethyl cellosolve, triethylene glycol monomethyl ether, diethylene glycol dimethyl ether, and diethylene glycol diethyl ether are preferable.

In the present invention, the concentration of the plating catalyst or precursor thereof in the catalyst liquid is appropriately adjusted according to the substrate to be subjected to plating.

The method of applying a metal that serves as an electroless plating catalyst or a metal salt that serves as an electroless plating catalyst precursor to the cured layer may be a method of forming a dispersion liquid that is obtained by dispersing a metal in an appropriate dispersion medium or a solution that is obtained by dissolving a metal salt in an appropriate solvent and eventually contains a dissociated metal ion, and coating the resulting dispersion liquid or solution on the polymer layer, or immersing a substrate formed thereon a polymer layer into the resulting dispersion liquid or solution.

Alternatively, a method in which an electroless plating catalyst or a precursor thereof is added to the coating solution, which is coated on the substrate in process (2) above, is also applicable. In a case in which a cured layer is formed by applying a coating liquid containing the electroless plating catalyst or precursor thereof onto the substrate, process (3) in the present invention may be omitted.

In a case in which a resin film is used as the substrate and a cured layer is formed on both sides of the resin film, the above immersion method is preferably used in order to bring the electroless plating catalyst or precursor thereof into contact with the cured layers formed on both sides at the same time.

In a case in which the electroless plating catalyst or precursor thereof is brought into contact with the cured layer as described above, by utilizing an interaction caused by an intermolecular force such as van der Waal's force or an interaction caused by a coordinate bond due to lone pair electrons, the electroless plating catalyst or precursor thereof can be adsorbed to the interactive group in the cured layer.

From the viewpoint of achieving sufficient adsorption, the concentration of metal in the dispersion liquid, the solution, or the composition or the concentration of metal ion in the solution is preferably in a range of from 0.001% by mass to 50% by mass, and more preferably in a range of from 0.005% by mass to 30% by mass. Furthermore, the contact time is preferably from about 30 seconds to about 24 hours, and more preferably from about 1 minute to about 1 hour.

(Other Catalyst)

In the present invention, in the case of directly performing electroplating without performing electroless plating with respect to the polymer layer in process (4) described below, a zero-valent metal can be used as the catalyst for the electroplating. Examples of the zero-valent metal include Pd, Ag, Cu, Ni, Al, Fe, and Co. Among them, those capable of multidentate coordination are preferable, and particularly, Pd, Ag, and Cu are preferable in view of the adsorptivity (adhesive property) with respect to the interactive group (cyano group) and the superiority in the catalytic ability.

Through performing process (3) as described above, an interaction between the interactive group in the polymer layer and the plating catalyst or precursor thereof can be formed.

[Process (4)]

In process (4), a plated film is formed by performing plating with respect to the polymer layer to which an electroless plating catalyst or a precursor thereof has been applied. The plating film thus formed has excellent electric conductivity and excellent adhesion.

Examples of the type of plating which may be performed in this process include electroless plating and electroplating. The type of plating may be selected according to the function of the plating catalyst or precursor thereof that has formed interaction with the polymer layer in the above-described process (3).

That is, in this process, either electroplating or electroless plating may be performed with respect to the polymer layer to which a plating catalyst or a precursor thereof has been applied.

Above all, in the present invention, it is preferable to perform electroless plating, from the viewpoints of the formability of a hybrid structure that occurs in the polymer layer and improvement in the adhesion. Further, in order to obtain a plated layer having a desired film thickness, it is more preferable to further perform electroplating after the electroless plating.

Hereinafter, the plating that is favorably performed in this process is explained.

(Electroless Plating)

Electroless plating refers to an operation of depositing a metal by means of a chemical reaction, using a solution prepared by dissolving ions of the intended metal to be deposited as plating.

The electroless plating in this process is performed by, for example, washing the substrate, to which an electroless plating catalyst has been applied, with water to remove excess electoless plating catalyst (metal), and then immersing the substrate in an electroless plating bath. As the electroless plating bath used herein, a generally known electroless plating bath can be used.

In a case in which a substrate to which an electroless plating catalyst precursor has been applied is immersed in an electoless plating bath, the substrate being in a state in which the electroless plating catalyst precursor is adsorbed or impregnated in the polymer layer, the substrate is washed with water to remove excess precursor (metal salt or the like), and then the resulting substrate is immersed in an electroless plating bath. In this case, reduction of the plating catalyst precursor and subsequent electroless plating are carried out in the electoless plating bath. Also in this case, as the electroless plating bath used herein, a generally known electroless plating bath can be used.

Further, other than the embodiment of using an electroless plating liquid as described above, it is possible to carry out the reduction of the electoless plating catalyst precursor, as a separate process prior to the electoless plating, by preparing a catalyst activating liquid (reducing liquid). The catalyst activating liquid is a liquid which is prepared by dissolving a reducing agent capable of reducing the electoless plating catalyst precursor (mainly, a metal ion) into a zero-valent metal, and is from 0.1% to 50%, and preferably from 1% to 30%. Examples of the reducing agent which can be used include boron based reducing agents such as sodium borohydride and dimethylamineborane, and reducing agents such as formaldehyde and phosphinic acid.

The composition of a general electroless plating bath mainly includes, besides a solvent, 1. a metal ion for plating, 2. a reducing agent, and 3. an additive (stabilizer) that improves the stability of the metal ion. This plating bath may further contain, in addition to the above components, known additives such as a stabilizer for the plating bath.

In a case in which a polymer layer having a low water absorbing property and a high hydrophobicity is subjected to plating, it is preferable that the solvent used in the plating bath contains an organic solvent that exhibits high affinity to the polymer layer. The type of the organic solvent may be selected, or the content of the organic solvent may be adjusted, according to the physical properties of the polymer layer. In particular, as the saturated water absorption coefficient at 25° C. and 50% relative humidity of the polymer layer gets bigger, it is preferable to reduce the content ratio of the organic solvent, which is described below in detail.

Specifically, in a case in which the saturated water absorption coefficient at 25° C. and 50% relative humidity of the polymer layer is from 0.01% by mass to 0.5% by mass, the content of the organic solvent in the entire solvent of the plating bath is preferably from 20% to 80%; in a case in which the saturated water absorption coefficient is from 0.5% by mass to 5% by mass, the content of the organic solvent in the entire solvent of the plating bath is preferably from 10% to 80%; in a case in which the saturated water absorption coefficient is from 5% by mass to 10% by mass, the content of the organic solvent in the entire solvent of the plating bath is preferably from 0% to 60%; and in a case in which the saturated water absorption coefficient is from 10% by mass to 20% by mass, the content of the organic solvent in the entire solvent of the plating bath is preferably from 0% to 45%.

The organic solvent used in the plating bath needs to be a solvent that is soluble in water, and from this point of view, a ketone such as acetone, or an alcohol such as methanol, ethanol, or isopropanol is preferably used.

Regarding the type of the metal used in the electroless plating bath, copper, tin, lead, nickel, gold, palladium, and rhodium are known. Among them, copper and gold are particularly preferable, from the viewpoint of electric conductivity.

There exist optimal reducing agents and additives according to the metal used in combination. For example, a copper electroless plating bath includes $CuSO_4$ as the salt of copper, HCOH as the reducing agent, a chelating agent that serves as a stabilizer of the copper ion, such as EDTA (ethylenediaminetetraacetic acid) or Rochelle salt, trialkanolamine, and the like, as the additive. Further, a plating bath used for electroless plating of CoNiP includes cobalt sulfate and nickel sulfate as the metal salts thereof, sodium hypophosphite as the reducing agent, and sodium malonate, sodium malate, or sodium succinate as a complexing agent. Moreover, a palladium electroless plating bath includes $(Pd(NH_3)_4)Cl_2$ as the metal ion, $NH_3$ or $H_2NNH_2$ as the reducing agent, and EDTA as a stabilizer. These plating baths may further include components other than the above components.

The film thickness of the plated film formed by electroless plating as described above may be controlled by adjusting the concentration of the metal ion in the plating bath, the immersion time in the plating bath, the temperature of the plating bath, or the like. From the viewpoint of electric conductivity, the film thickness of the plated film is preferably 0.5 µm or more, and more preferably 3 µm or more.

The immersion time in the plating bath is preferably from about 1 minute to about 6 hours, and more preferably from about 1 minute to about 3 hours.

The plated film obtained by electroless plating as described above may be confirmed by cross-section observation using SEM that fine particles of the electroless plating catalyst or the plating metal are tightly dispersed in the polymer layer, and that the plating metal is deposited on the polymer layer. Since the interface between the substrate and the plating film is in a hybrid state of the polymer and the fine particles, satisfactory adhesion may be achieved, even if the interface between the substrate (organic component) and the inorganic substance (catalyst metal or plating metal) is smooth (for example, a difference between concavity and convexity is 500 nm or less).

(Electroplating)

In this process, in a case in which the plating catalyst or precursor thereof applied in process (3) has a function as an electrode, electroplating can be performed with respect to the cured layer to which the plating catalyst or precursor thereof has been applied.

Further, electroplating may be performed, after performing the above-described electroless plating, using the formed plating film as an electrode. In this case, a new metal film having an arbitrary thickness can be readily formed by using the electroless plating film, that exhibits excellent adhesion to the substrate, as a base. Thus, it is possible to form a metal film having a thickness according to the purpose by performing electroplating after the electroless plating, which is preferable to apply the metal film according to the present invention to various applications.

As to the method of performing electroplating in the present invention, a conventionally known method can be used. Examples of a metal which may be used in the electroplating in this process include copper, chrome, lead, nickel, gold, silver, tin, and zinc. From the viewpoint of electric conductivity, copper, gold, and silver are preferable, and copper is more preferable.

The film thickness of the metal film obtained by electroplating may vary with the usage and may be controlled by adjusting the concentration of the metal contained in the plating bath, the current density, or the like. For example, in the case of using the metal film for general electrical wirings or the like, the film thickness is preferably 0.5 µm or more, and more preferably 3 µm or more, from the viewpoint of electric conductivity.

In the present invention, when the metal or metal salt derived from the plating catalyst or the plating catalyst precursor, and/or the metal that has been separated in the polymer layer by electroless plating is (are) formed in the form of a fractal fine structure in the polymer layer, adhesion between the metal film and the polymer layer can be further improved.

Regarding the amount of the metal that is present in the polymer layer, in a case in which the proportion of metal in a region from the outermost surface of the polymer layer to a depth of 0.5 µm is from 5% to 50% by area, and the arithmetic average roughness Ra (JIS B0633-2001 at the interface between the polymer layer and the metal is from 0.05 µm to 0.5 µm, as observed in a photograph of a cross-section of the substrate obtained by using a metal microscope, a stronger adhesive force may be realized.

In the surface metal film material thus obtained, when x µm represents the surface roughness (Ra) at the interface between the substrate and the polymer layer, and y µm represents the surface roughness (Ra) at the interface between the polymer layer and the metal film, the surface roughness satisfies a relationship of: $x>y$; and $5\ \mu m>x>0.1\ \mu m$. It is more preferable that x and y satisfy a relationship of: $x>y$; and $3\ \mu m>x\geq0.8\ \mu m$. When x and y are within this range, the surface metal film material may have excellent smoothness and excellent adhesive force between the metal film and the substrate, peeling off of a pattern may be prevented from occurring even formed in a patterned manner, and the effects of the present invention can be realized without being impaired.

<Surface Metal Film Material>

By going through the respective processes of the method of producing a surface metal film material of the present invention, a surface metal film material of the present invention can be obtained.

Further, when a resin film or the like is used as a substrate in the method of producing a surface metal film material of the present invention, a surface metal film material having a metal film formed on both sides of the resin film can be obtained.

The surface metal film material obtained by the method of producing a surface metal film material of the present invention has excellent adhesive force between the metal film and the substrate.

The method of producing a metal pattern material of the present invention is a method of performing a process of etching, in a patterned manner, the plated film of the surface metal film material of the present invention obtained through performing processes (1) to (4) [process (5)], or a process of etching the plated film and the polymer layer in a patterned manner [process (6)]. Hereinafter, process (5) and process (6) are explained.

[Process (5) and Process (6)]

In process (5), the plated film (metal film) formed in process (4) above is etched in a in a patterned manner. Alternatively, the plated layer formed in process (4) above and the polymer layer are etched in a patterned manner in process (6). Specifically, in the process, a desired metal pattern can be formed, by performing etching to remove unnecessary portions of the plated film that has been formed over the entire surface of the substrate, or by performing etching to remove unnecessary portions of the plated film and the polymer layer.

Any technique may be used for the formation of the metal pattern. Specifically, a generally known subtractive method or semi-additive method is used.

The subtractive method is a method of forming a metal pattern, the method including: providing a dry film resist layer on the formed plated film; forming the same pattern as that of the metal pattern portion by carrying out pattern exposure and development; and removing the plated film with an etching liquid using the dry film resist pattern as a mask. Any material can be used as the dry film resist, and a negative type material, a positive type material, a liquid material, or a film-shaped material can be used. The etching method may be any method that is used in the production of print wiring boards, and wet etching, dry etching, or the like can be used. The etching method may be arbitrary selected. From the viewpoint of operability, a wet etching device or the like is simple and preferable. As the etching liquid, for example, an aqueous solution of cupric chloride, ferric chloride, or the like can be used.

The semi-additive method is a method of forming a metal pattern, the method including: providing a dry film resist layer on the formed plated film; forming the same pattern as that of the non-metal pattern portion by carrying out pattern exposure and development; performing electroplating using the dry film resist pattern as a mask; carrying out quick etching after removing the dry film resist pattern; and removing the plated film in a patterned manner. The materials for the dry film resist, etching liquid, and the like may be the same materials as those used in the subtractive method. As the technique for electroplating, the technique described above may be used.

Especially in the present invention, it is preferable to etch not only the plated film but also both the plated film and the polymer layer, in a patterned manner. This method is advantageous in that, since a substrate surface having a great surface roughness is exposed again, when an insulating resin is laminated by a build-up method, strong adhesion to the insulating layer can be realized.

By going through processes (1) to (5) described above, or processes (1) to (4) and process (6), a metal pattern material having a desired metal pattern may be produced.

On the other hand, a metal pattern material can be also produced by forming the polymer layer obtained in process (2) in a patterned manner and performing processes (3) and (4) to the polymer layer that has been formed in a patterned manner (a full additive method).

Regarding the method of forming the polymer layer obtained in process (2) in a patterned manner, specifically, it is enough to use pattern exposure in the formation of the polymer layer, and by developing the same to remove the unexposed portion, a polymer layer with a pattern can be formed.

Note that, the development may be carried out by immersing the substance in a solvent capable of dissolving materials used for forming the polymer layer, such as a polymer or a monomer. The time for immersion is preferably from 1 minute to 30 minutes.

Further, the polymer layer obtained in process (2) may be formed by directly conducting patterning according to a known coating method such as a gravure printing method, an inkjet method, a spray coat method using a mask, or the like, then applying energy to the same, and then washing (developing) the same.

Processes (3) and (4) for forming a plating film on the polymer layer that has been formed in a patterned manner are the same as the methods described above.

<Metal Pattern Material>

The metal pattern material of the present invention is a material obtained by the above-described method of producing a metal pattern material of the present invention.

The obtained metal pattern material has a metal pattern which exhibits excellent adhesion to the substrate.

Since the polymer layer that forms the metal pattern material has a low water absorbing property and a high hydrophobicity, changes in water absorption, moisture absorption, or the like do not occur in an exposed portion of the polymer layer (a region where the metal pattern is not formed) and thus, deterioration in insulating property due to such changes may not occur. As a result, the metal pattern material formed by the method of producing a metal pattern material of the present invention exhibits excellent insulation reliability in a region where a metal pattern is not formed.

The metal pattern material of the present invention preferably has a metal film (plated film) provided on the entire surface of a substrate or on a part of the substrate, in which the substrate has a surface concavity and convexity of 500 nm or less (more preferably 100 nm or less). Further, the value of adhesion between the substrate and the metal pattern is preferably 0.2 kN/m or more, and particularly preferably 0.5 kN/m or more. Namely, the metal pattern material of the present invention is characterized in that, while the surface of the substrate is smooth, the metal pattern material exhibits excellent adhesion between the substrate and the metal pattern.

The value of adhesion between the substrate and the metal film is a value obtained by adhering a copper plate (having a thickness of 0.1 mm) to the surface of the metal film (metal pattern) using an epoxy-based adhesive (ARALDITE, manufactured by Ciba-Geigy Co., Ltd.), drying the same at 140° C. for 4 hours, and then performing a 90-degree peeling test based on JIS C 6481 or directly peeling off an edge portion of the metal film itself and performing a 90-degree peeling test based on JIS C 6481.

The metal pattern material obtained by the method of producing a metal pattern material of the present invention can be applied to various usage, for example, in semiconductor chips, various electrical wiring boards, FPC, COF, TAB, antennas, multilayer wiring boards, mother boards, or the like.

EXAMPLES

Hereinafter, the present invention is described with reference to Examples, but the scope of the present invention is not limited to these Examples. Unless stated otherwise, the "%" and "parts" are based on mass.

Example 1

(Synthesis of Polymer A Having Polymerizable Group and Interactive Group)

Firstly, polymer A having a polymerizable group and an interactive group was synthesized as described below.

In a 500 mL three-necked flask, 20 mL of ethylene glycol diacetate, 7.43 g of hydroxyethyl acrylate, and 32.03 g of cyanoethyl acrylate were placed and heated to 80° C. Then, a mixed liquid formed from 0.737 g of V-601 (polymerization initiator, manufactured by Wako Pure Chemical Industries, Ltd.) and 20 mL of ethylene glycol diacetate was added thereto dropwise over 4 hours. After the completion of the dropwise addition, the resulting mixture was allowed to react for 3 hours.

To the above reaction solution, 0.32 g of di-tert-butylhydroquinone, 1.04 g of U-600 (manufactured by Nitto Kasei Co., Ltd.), 21.87 g of KARENZ AOI (manufactured by Syowa Denko K. K.), and 22 g of ethylene glycol diacetate were added and the resulting reaction liquid was allowed to react at 55° C. for 6 hours. Thereafter, 4.1 g of methanol were added to the reaction liquid, and the mixture was allowed to react further for 1.5 hours. After the completion of the reaction, reprecipitation was performed with water and a solid matter was collected to obtain 35 g of polymer A which is a specific polymer having a nitrile group as the interactive group. It was confirmed that Polymerizable group-containing unit:Nitrile group-containing unit=22:78 (by mole ratio). Further, it was confirmed that the molecular weight was Mw=82,000 (Mw/Mn=3.4) in terms of polystyrene.

(Preparation of Coating Liquid)

30 parts by mass of the above specific polymer A and 70 parts by mass of acetonitrile were mixed and stirred, to prepare a coating liquid having a solid content of 30%.

[Production of Substrate]

An epoxy-based insulating film GX-13 (manufactured by Ajinomoto Fine-Techno Co., Inc. (film thickness of 40 µm) as an electrically insulating layer was heated and pressed on a glass epoxy substrate, and adhered to the substrate by using a vacuum laminator at a pressure of 0.2 MPa under the condition of from 100° C. to 110° C. Thereby, substrate B1 was obtained.

Desmear Treatment to Substrate B1

A conditioner aqueous solution including sodium hydroxide and a solvent was prepared as a conditioner liquid, and then, the surface of the insulating film was subjected to a swelling treatment by treating it with this conditioner aqueous solution at 75° C. for 10 minutes while stirring. Then, a treatment was performed with warm water at 50° C. for 3 minutes, and then a desmear treatment was performed while stirring at 85° C. for 10 minutes, using an aqueous sodium hydroxide solution containing potassium permanganate. Thereafter, a treatment was performed with warm water at 50° C. for 3 minutes, and then a neutralization treatment was performed while stirring at 45° C. for 5 minutes, using a neutralization treatment aqueous solution containing sulfuric acid.

In this way, substrate B2 was obtained.

[Formation of Polymer Layer]

(Coating and Drying)

The coating liquid containing the specific polymer A obtained as described above was coated on the above substrate B2 in a manner such that the thickness after drying was 3.0 µm, by a dip method at a dip lifting speed of 4 mm/sec, followed by drying at 80° C. for 5 minutes.

(Exposure)

Thereafter, using 1.5 kW high-pressure mercury lamp (UVX-02516SILP01, manufactured by Ushio Inc.), exposure was performed in a manner such that the exposure amount at 254 nm was 100 mJ/cm$^2$. Thereby, a cured layer of a polymer layer was formed on the entire surface of the substrate B2.

In this way, substrate B3 having a cured layer was obtained.

[Application of Plating Catalyst]

A palladium catalyst liquid formed from 39 parts by weight of diethylene glycol diethyl ether (manufactured by Wako Pure Chemical Industries, Ltd.) as a water-soluble organic solvent, 40.75 parts by weight of water, 20 parts by weight of nitric acid (manufactured by Wako Pure Chemical Industries, Ltd.), and 0.25 parts by weight of palladium acetate (manufactured by Wako Pure Chemical Industries, Ltd.) was prepared. Then, the substrate B3 obtained in the above-described process was immersed in this palladium catalyst liquid for 5 minutes, followed by washing with water.

[Electroless Plating]

Thereafter, using THRU-CUP PGT (manufactured by C. Uyemura & Co., Ltd.) and using a electroless plating bath having the composition described below, electroless plating was conducted at an electroless plating temperature of 26° C. for 30 minutes. Each thickness of the resulting electroless copper plating films on the insulating layer and on the bottom of via, the thickness was 0.5 µm.

Raw materials of the electroless plating liquid are as follows.

| | |
|---|---|
| Distilled water | 79.2% by mass |
| PGT-A | 9.0% by mass |
| PGT-B | 6.0% by mass |
| PGT-C | 3.5% by mass |
| Formalin (manufactured by Wako Pure Chemical Industries, Ltd.; formaldehyde liquid) | 2.3% by mass |

[Electroplating]

Subsequently, using the electroless copper plating films as feed layers and using an electric copper plating bath having the composition described below, electroplating was conducted for 20 minutes, under the condition of 3 A/dm$^2$. The thickness of the resulting electric copper plating film was 18 µm. The obtained substrate was designated as substrate B4.

(Composition of Electroplating Bath)

| | |
|---|---|
| Copper sulfate | 38 g |
| Sulfuric acid | 95 g |
| Hydrochloric acid | 1 mL |
| COPPER GLEAM PCM (manufactured by Meltex Inc.) | 3 mL |
| Water | 500 g |

The strength of peeling between the polymer layer and the metal film of the obtained substrate B4 was measured by the following method.

(Peel Strength)

The value of peel strength is a value obtained by adhering a copper plate (having a thickness of 0.1 mm) to the surface of the metal film with an epoxy-based adhesive (ARALDITE, manufactured by Ciba-Geigy Co., Ltd.), drying the same at 140° C. for 4 hours, and then performing a 90-degree peeling test based on JIS C 6481, or directly peeling off an edge portion of the metal film itself and performing a 90-degree peeling test based on JIS C 6481. When the above value is 0.5 kN/m or more, it means that the adhesion is especially favorable.

Wiring lines having L/S=30/30 μm were formed on the obtained substrate B4 in accordance with a subtractive method.

Firstly, the substrate B4 was subjected to a metal surface degreasing treatment at 40° C. for 1 minute using the degreasing liquid described below, followed by washing with water.

| | |
|---|---|
| Distilled water | 95% by mass |
| MELPLATE PC-316 (manufactured by Meltex Inc.) | 5% by mass |

Thereafter, a dry film resist was formed on the surface of the metal film. Then, using 1.5 kW high-pressure mercury lamp (UVX-02516SILP01, manufactured by Ushio Inc.), exposure was performed in a manner such that the exposure amount, through a mask, at 365 nm was 100 mJ/cm$^2$. Then, development was performed using a 1% aqueous solution of $Na_2CO_3$ at a temperature of 40° C. to form a positive pattern having L/S=30/30 μm. The exposed metal surface was removed at a temperature of 40° C. using an etching liquid. Note that, the etching liquid was formed from 98.6% by mass of an aqueous solution of ferric chloride (manufactured by Tsurumi Soda Co., Ltd.), and 1.4% by mass of a 35% aqueous solution of hydrochloric acid. Thereafter, the dry film resist was peeled off, using a 3% aqueous solution of NaOH at a temperature of 50° C.

Example 1 was conducted in such a manner as described above. The results are shown in Table 1 together with the results of Examples 2 to 6 and Comparative Examples 1 to 4.

(Wiring Formability)

Evaluation of wiring formability was conducted according to the following evaluation criteria.

<Evaluation Criteria for Wiring Formability>

A: Wiring lines are formed according to a desired pattern, and side etching does not occur.

B: Wiring lines are formed according to a desired pattern, but side etching occurs when the metal residues are removed.

C: When the metal residues are removed, a shape that is not suitable for an electrical wiring layer (for example, a reverse taper shape or a shape such that the center portion of the wiring has sunken) is provided, and wiring lines according to a desired pattern are not formed.

D: Wiring lines are not formed.

(Surface Roughness)

Surface roughness (Ra) of a surface of a substrate or the like was measured using SURFCOM 3000A (manufactured by Tokyo Seimitsu Co., Ltd) in accordance with a non-contact interference method based on JIS B0601 (revised Jan. 20, 2001).

Further, the surface roughness (x and y) at the interfaces are values measured by observing a cross-section thereof using SEM, and each arithmetic average roughness was measured in accordance with JIS B0633-2001.

Example 2

Example 2 was conducted in a manner similar to that in Example 1, except that the coating liquid in Example 1 was changed to the composition described below. Evaluation was performed in a manner similar to that in Example 1.

(Composition of Coating Liquid in Example 2)

(Preparation of Coating Liquid)

30 parts by mass of the above specific polymer A, 6 parts by mass of SILANE COUPLING AGENT LS2940 (manufactured by Shin-Etsu Chemical Co., Ltd.), and 64 parts by mass of acetonitrile were mixed and stirred, to prepare a 30% coating liquid in terms of a solid content of the specific polymer.

Example 3

Example 3 was conducted in a manner similar to that in Example 1, except that the coating liquid containing the polymer A in Example 1 was changed to the coating liquid described below, and a substrate having a polymer layer that had been obtained through drying at 80° C. for 5 minutes and then at 120° C. for 30 minutes was used. Evaluation was performed in a manner similar to that in Example 1.

(Coating Liquid Used in Example 3)

Polymerization of N,N-dicyanoethylacrylamide is carried out according to a conventional method of radical polymerization to obtain poly(N,N-dicyanoethylacrylamide) (weight average molecular weight of 70,000). An acetonitrile solution containing 30% by mass of the obtained polymer Example 4

Example 4 was conducted in a manner similar to that in Example 1, except that the coating liquid containing the polymer A in Example 1 was changed to the coating liquid described below, and a substrate having a polymer layer that had been obtained by drying at 40° C. for 5 minutes and then at 120° C. for 30 minutes was used. Evaluation was performed in a manner to that in Example 1.

(Coating Liquid Used in Example 4)

A methanol solution containing 30% by mass of polyacrylic acid (manufactured by Sigma-Aldrich Corporation) (weight average molecular weight of 130,000)

Example 5

Example 5 was conducted in a manner similar to that in Example 1, except that the coating liquid containing the polymer A in Example 1 was changed to the coating liquid described below, and a substrate having a polymer layer that had been obtained by drying at 40° C. for 5 minutes and then at 120° C. for 30 minutes was used. Evaluation was performed in a manner similar to that in Example 1.

(Coating Liquid Used in Example 5)

A methanol solution containing 30% by mass of polyvinylpyridine (manufactured by Sigma-Aldrich Corporation) (weight average molecular weight of 120,000)

Comparative Example 1

Comparative Example 1 was conducted in a manner similar to that in Example 1, except that the thickness of the polymer layer in Example 1 was changed from 3.0 μm to 1.0 μm. Evaluation was performed in a manner similar to that as in Example 1.

Comparative Example 2

The application of plating catalyst, electroless plating and electroplating (including the composition of electroplating bath) in Comparative Example 2 was conducted in a manner similar to that in Example 1, except that the substrate B1 was used in place of the substrate B3 in Example 1. Evaluation was performed in a manner similar to that in Example 1.

Comparative Example 3

The application of plating catalyst, electroless plating and electroplating (including the composition of electroplating bath) in Comparative Example 3 was conducted in a manner similar to that in Example 1, except that a substrate obtained by performing plating in the state of substrate B2 was used in place of the substrate B3 in Example 1. Evaluation was performed in a manner similar to that in Example 1.

Comparative Example 4

Comparative Example 4 was conducted in a manner similar to that in Example 1, except that the substrate B4 in Example 1 was changed to a silicone wafer having a surface roughness (Ra) of 0.003 µm, and the desmear treatment was not performed. Evaluation was performed in a manner similar to that in Example 1.

Comparative Example 5

An epoxy-based insulating film GX-13 manufactured by Ajinomoto Fine-Techno Co., Inc (film thickness of 40 µm) as a polymer layer was provided on a silicone wafer, and then heated and pressed, and then adhered to the silicone wafer by using a vacuum laminator at a pressure of 0.2 MPa under the condition of from 100° C. to 110° C. Using this substrate and in a manner similar to that in Example 1, a desmear treatment was performed, and then a catalyst was applied to the surface and then plating was performed. Evaluation was performed in a manner similar to that as in Example 1.

roughness of more than 0.1 µm and a plating catalyst or a precursor thereof is applied to the polymer layer, exhibited a great peel strength between the metal film and the substrate and satisfactory wiring formability. In contrast, Comparative Example 1 in which T and x does not satisfy the relationship $2x \leq T$ exhibited wiring formability such that since the influence of the roughening of the insulating film is not improved, it is difficult to remove a metal residue between the wiring lines. Comparative Example 4-2 and Comparative Example 3, in which a polymer layer was not provided, and Comparative Example 4 in which the surface roughness of the substrate was 0.1 µm or less, exhibited poor wiring formability, and Comparative Example 2 and Comparative Example 4 exhibited low peel strength. Further, in Comparative Example 5, in which the surface roughness at the interface between the substrate and the polymer layer was smaller than the surface roughness at the interface between the polymer layer and the metal film, although the influence of concavity and convexity of the substrate surface was suppressed, complete flatness and smoothness were not achieved, and thus, the wiring formability was insufficient.

Moreover, in order to confirm the effect to be realized when the polymer layer is etched, the following experiment was conducted.

With regard to the substrate obtained by a subtractive method, a specific resin exposed between the wiring lines was subjected to ashing using CDP-101 manufactured by K-Tech Research Corp. to expose the roughened insulating film. Thereafter, an epoxy-based insulating film GX-13 manufactured by Ajinomoto Fine-Techno Co., Inc.(film thickness of 40 µm) as another electrically insulating layer was heated and pressed, and adhered by using a vacuum laminator at a pressure of 0.2 MPa under the condition of from 100° C. to 110° C. As a result, it was confirmed that satisfactory adhesion to the laminated insulating layer was obtained in Examples 1 to 5.

TABLE 1

| | Surface Roughness X of Substrate Surface (µm) | Interface Roughness x (µm) | Surface Roughness Y of Outermost Surface of Substrate (µm) | Interface Roughness y (µm) | Peel Strength (kN/m) | | Wiring Formability |
|---|---|---|---|---|---|---|---|
| Example 1 | 0.8 | 0.8 | 0.05 | 0.05 | 0.5 | A | good |
| Example 2 | 0.8 | 0.8 | 0.05 | 0.05 | 0.7 | A | good |
| Example 3 | 0.8 | 0.8 | 0.05 | 0.05 | 0.5 | A | good |
| Example 4 | 0.8 | 0.8 | 0.05 | 0.05 | 0.5 | A | good |
| Example 5 | 0.8 | 0.8 | 0.05 | 0.05 | 0.5 | A | good |
| Comparative Example 1 | 0.8 | 0.8 | 0.40 | 0.40 | 0.5 | B | Since the influence of the roughening of the insulating film is not improved, it is difficult to remove a metal residue between the wiring lines. Side etching occurs. |
| Comparative Example 2 | 1.0 | 1.0 | 0.20 | 0.20 | 0.1 | D | The metal peels off during the formation of the wiring. |
| Comparative Example 3 | 1.0 | 1.0 | 0.80 | 0.80 | 0.5 | C | Due to the roughening of the insulating film, it is difficult to remove metal residues between the wiring lines. Side etching occurs. |
| Comparative Example 4 | 0.003 | 0.003 | 0.05 | 0.05 | 0.1 | D | A metal peels off during formation of the wiring. |
| Comparative Example 5 | 0.003 | 0.003 | 0.80 | 0.80 | 0.3 | C | Due to roughening of the insulating film, it is difficult to remove a metal residue between wiring lines. Side etching occurs. |

From Table 1, the followings are seen. Namely, Examples 1 to 5, which were obtained by the method of producing a surface metal film material of the present invention in which a polymer layer is provided on a substrate having a surface

The invention claimed is:

1. A surface metal film material comprising, in this order, a substrate, a polymer layer that receives a plating catalyst or a precursor thereof, and a metal film formed by plating, wherein, when x μm represents surface roughness (Ra) at an interface between the substrate and the polymer layer, and y μm represents surface roughness (Ra) at an interface between the polymer layer and the metal film, x>y, wherein, when T μm represents a thickness of the polymer layer, T and x satisfy the relationship $2x \leq T$, wherein the surface roughness (Ra) at the interface between the substrate and the polymer layer satisfies a relationship: $3 \mu m > x \geq 0.8 \mu m$, and wherein the surface roughness (Ra) at the interface between the polymer layer and the metal film is from 0.05 μm to 0.5 μm wherein the metal film is etched to form a metal pattern.

2. The surface metal film material according to claim 1, wherein the polymer layer that receives a plating catalyst or a precursor thereof is a layer formed by coating, on the substrate, a coating liquid comprising a compound having a functional group that forms an interaction with the plating catalyst or precursor thereof.

* * * * *